United States Patent [19]

Davis et al.

[11] Patent Number: 4,849,068
[45] Date of Patent: Jul. 18, 1989

[54] APPARATUS AND METHOD FOR PLASMA-ASSISTED ETCHING

[75] Inventors: Cecil J. Davis, Greenville; Duane E. Carter, Plano; Rhett B. Jucha, Celeste, all of Tex.

[73] Assignee: Texas Instruments Incorporated, Dallas, Tex.

[21] Appl. No.: 211,110

[22] Filed: Jun. 21, 1988

Related U.S. Application Data

[60] Continuation of Ser. No. 73,678, Jul. 14, 1987, abandoned, which is a division of Ser. No. 790,707, Oct. 24, 1985, Pat. No. 4,685,999.

[51] Int. Cl.⁴ .................... B44C 1/22; C03C 15/00; C03C 25/06
[52] U.S. Cl. .................... 156/643; 156/345; 156/646
[58] Field of Search .................... 156/345, 643, 646; 427/38, 39; 118/50.1, 620, 728; 204/192.32, 192.34, 298

[56] References Cited

U.S. PATENT DOCUMENTS

| | | | |
|---|---|---|---|
| 4,230,515 | 10/1980 | Zajac | 156/345 |
| 4,307,283 | 12/1981 | Zajac | 156/345 X |
| 4,685,999 | 8/1987 | Davis et al. | 156/345 X |

*Primary Examiner*—William A. Powell
*Attorney, Agent, or Firm*—Joseph E. Rogers; James T. Comfort; Melvin Sharp

[57] ABSTRACT

An apparatus for reactive ion etching or plasma etching wherein the wafer faces downward. The process gas is supplied through a distributor which is below the wafer and has orifices pointing away from the wafer. The vacuum (exhaust) port is below the distributor, so that there is no bulk gas flow near the face of the wafer. Preferably transport of the process gasses and their products to the face of the wafer is dominated by diffusion.

24 Claims, 2 Drawing Sheets

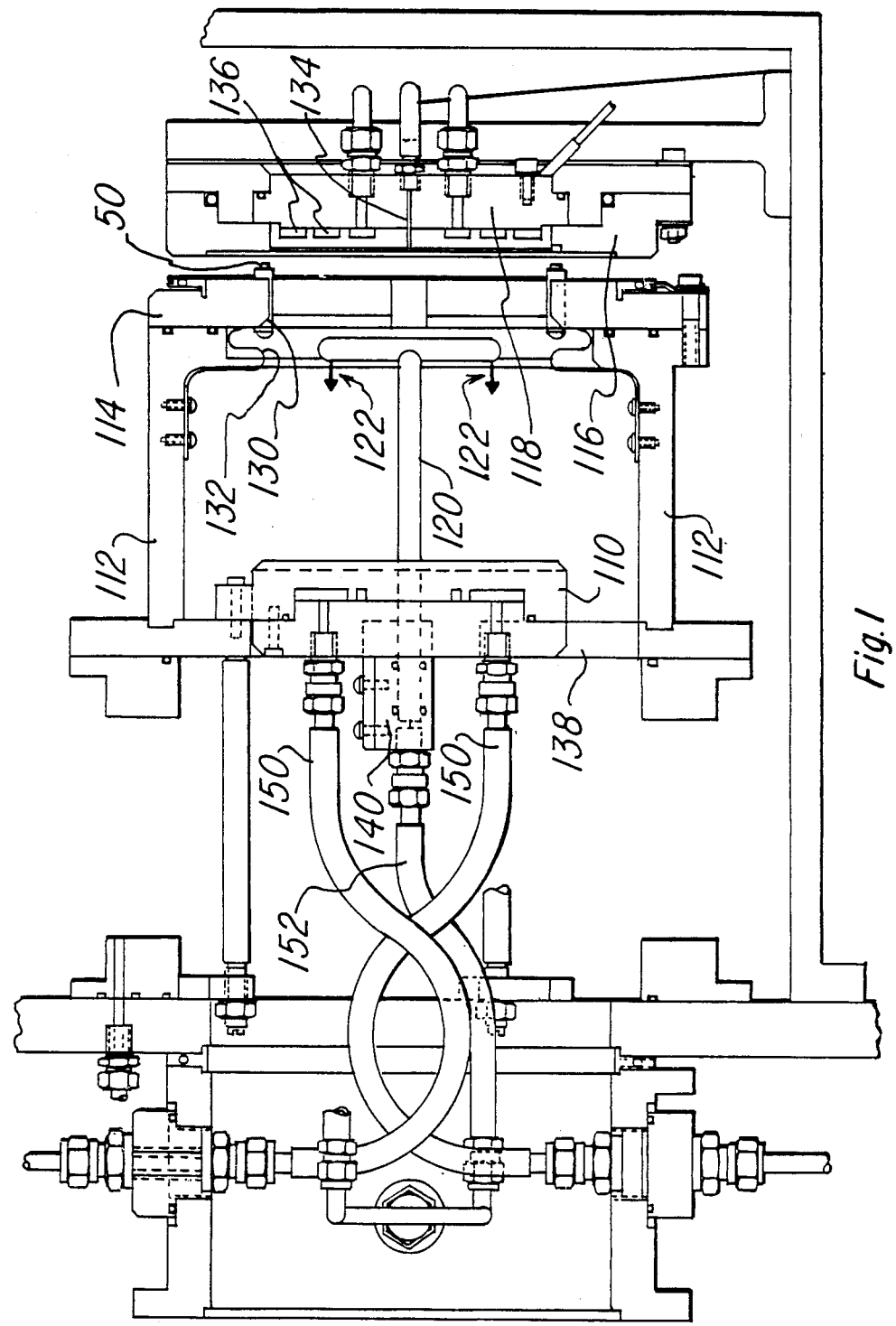

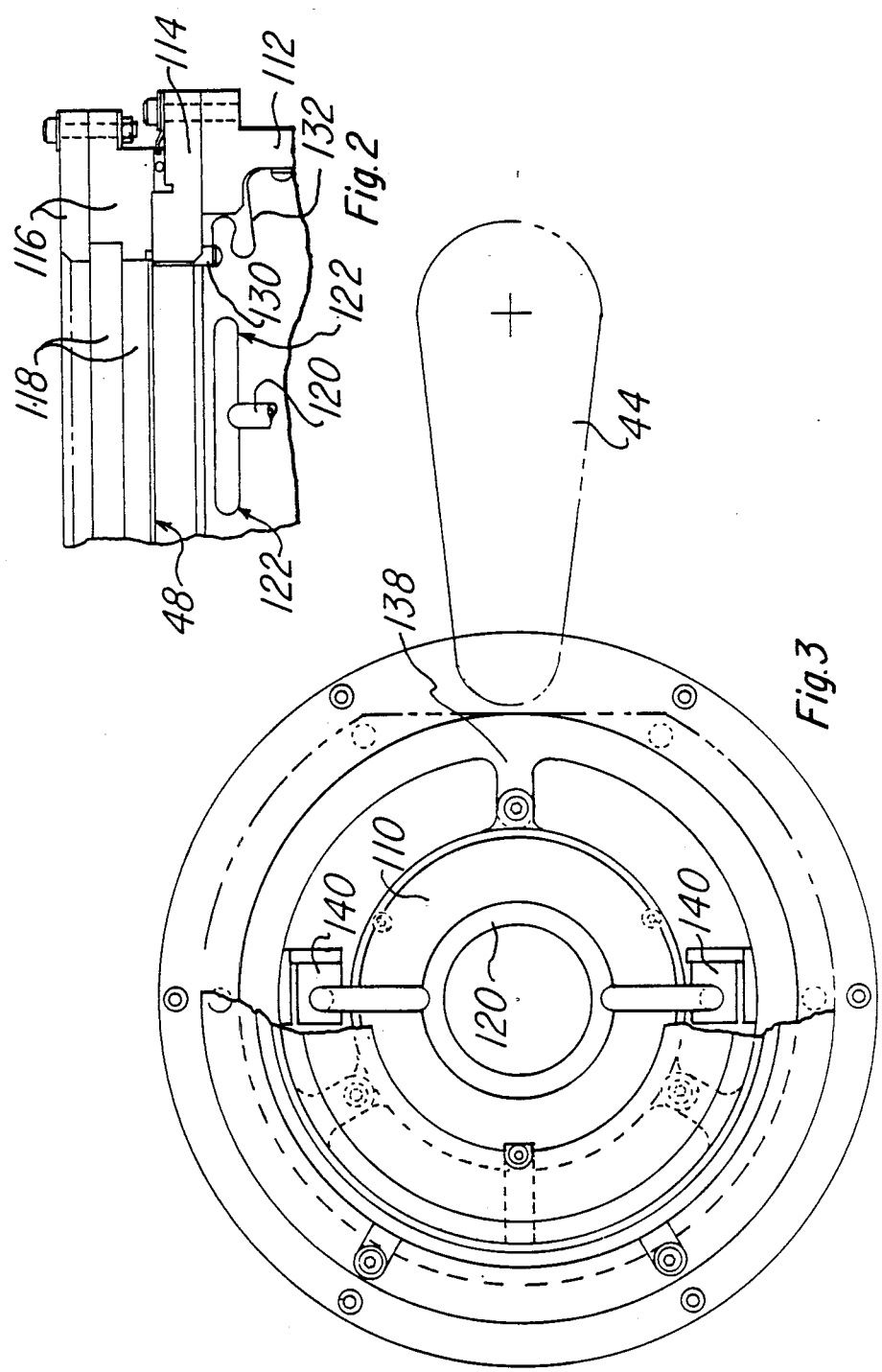

APPARATUS AND METHOD FOR PLASMA-ASSISTED ETCHING

This application is a continuation of application Ser. No. 073,678 filed July 14, 1987, now abandoned, which is a division of Ser. No. 790,707 filed Oct. 24, 1985, now U.S. Pat. No. 4,685,999.

BACKGROUND AND SUMMARY OF THE INVENTION

The present invention relates to apparatus for manufacturing of integrated circuits.

One of the basic problems in integrated circuit manufacturing is particulates. This problem is becoming more and more difficult, because of two trends in integrated circuit processing: First, as device dimensions become smaller and smaller, it is necessary to avoid the presence of smaller and smaller particles. This makes the job of making sure that a clean room is really clean increasingly difficult. For example, a clean room which is of class 1 (has one particle per cubic foot) for particles of one micron and larger may well be class 1000 or worse if particle sizes down to 100 angstroms are counted.

Second, there is increased desire to use large size integrated circuit patterns: for example, integrated circuit sizes larger than 50,000 square mils are much more commonly used now than they were five years ago.

Thus, particulates are not only an extremely important source of loss in integrated circuit manufacturing, but their importance will increase very rapidly in the coming years. Thus, it is an object of the present invention to provide methods for fabricating integrated circuits with reduced particulate contamination.

A common problem with prior art plasma etching machines has been particulate generation. Typically plasma etching stations are among the worst stations for depositions of particulates on the sensitive active area of the wafers. One particularly difficult area is the use of "shower head" gas distribution systems, where gas is distributed to the face of the wafer through multiple holes in the face of the active electrode. While this arrangement would seem to to be an attractive way to provide a highly uniform distribution of available process gasses over the face of the wafer, in practice, polymeric or other byproducts of the plasma phase reactions tend to deposit in the holes in the shower head, providing particulates which can be blown through and then immediately deposited on the wafer. Other arrangements for supplying process gasses have their own problems; problems of nonuniformity are common to many gas supply arrangements.

A novel teaching of the present invention is that the flow of gasses to the wafer face should be dominated by diffusion. That is, this aspect of the present invention provides a low-pressure plasma etching (or reactive ion etching) station wherein there is no bulk gas flow over the wafer face. That is, the feed gas species (which are needed for the plasma reactions which will produce the desired ions and free radicals to actually effect etching) are transported into the high-field region close to the face of the plasma (where they will be available for dissociation), not by bulk flow of a gas stream, nor (preferably) even by turbulent eddy currents in a region where there is no overall average bulk flow, but by diffusion. This means that particulate transport by gas-flow-assisted transport to the face of the wafer is greatly reduced.

In a further feature of this plasma reactor, the feed gas distributor is made of an insulating material. The feed gas distributor can thus be positioned reasonably close to the wafer face (i.e. less than one wafer diameter away) to help assure uniform availability of the reaction gasses, but there will not be a large potential drop across the dark zone in the plasma immediately adjacent to the feed gas distributor (as there would be if the distributor were made of a conductive material), and thus deposition of polymeric or other plasma reaction products on the feed gas distributor will be reduced. This means that transport of these reaction products to the wafer face as particulates will also be reduced.

In a further feature of the invention, wafers are etched in a face down position, and a gas distributor is provided which is below the wafer face and has ports blowing away from the wafer. This helps to assure that the bulk gas flow is downward and away from the wafer face, and thus reduces the likelihood of transport of particulates to the wafer face. Preferably the vacuum (exhaust) port is below the distributor.

A further innovative feature taught by the present application is a plasma (or RIE) reactor for face down etching of wafers, wherein essentially all of the grounded metal reactor chamber walls seen by the plasma move as a unit to open and close the reactor. That is, a bellows (preferably vacuum tight) is provided which supports the counter electrode opposite the wafer, and also supports the chamber sidewalls and (preferably) the process gas distribution distributor, so that all of these elements move as a unit. By reducing mechanical movements in proximity to the wafer, generation of particulates thereby is reduced.

The prior art of openable and closeable RIE reactors would typically use complex mechanical actuators, such as feedthroughs or cams, to clamp the wafers in place. However, in the present invention, the only moving mechanical elements are the wafer support pins, which are mounted on (and move only a short distance against the pressure of) an elastic support, so that the process chamber bottom portions can be closed against the powered electrode support when the plasma reactor is sealed to begin plasma etching.

Another innovative feature of this embodiment is that a quartz top layer is provided on the chamber housing, as the layer which will mate to the powered electrode support. This quartz top layer helps to preserve a high area ratio of powered electrode area to ground plane area in the chamber, which provides enhanced ion bombardment on the powered electrode, which is well known to those skilled in the art. This enhanced bombardment is desirable to assist in anisotropic wafer etching. The use of quartz here is further advantageous in that it is transparent to a wide variety of ultraviolet wavelengths, so that optical end point detection, and operator inspection of the plasma etching operation, are both facilitated.

The quartz top layer is also configured to provide excellent uniformity of ion bombardment. That is, the plasma is confined by quartz walls, for several centimeters away from the face of the wafer, to the shape of a cylinder having approximately the same width as the wafer. This collimation of the plasma provides improved uniformity of ion bombardment, which results in the advantage of more uniform etching. Walls made of quartz (or other high-temperature dielectric) are particularly well suited for this collimation, since they have less interaction with the plasma than metal walls would.

A further innovative feature is that a light bleed of helium is preferably provided to the back side of the wafer. This helium bleed assures good and uniform thermal contact between the wafer and the powered electrode under vacuum.

According to the present invention there is provided: An apparatus for plasma-assisted etching of integrated circuits, comprising: wafer supports for supporting a wafer containing partially fabricated integrated circuits face down, with the backside of said wafer adjacent to a powered electrode; a ground electrode positioned approximately in opposition to said powered electrode, said grounded electrode being supported by a base plate in fixed relation to reactor sidewalls; and a gas distributor which is fixed in relation to said grounded electrode; said grounded electrode and sidewalls being movable as a unit toward said powered electrode to effect a vacuum-tight seal between said powered electrode and sidewalls.

According to the present invention there is also provided: A plasma reactor comprising: supports shaped to hold a partially fabricated integrated circuit wafer face down; connections to communicate rf power to said wafer; and a gas distributor comprising orifices connected to exude gas in proximity to said water face, said gas distributor consisting essentially of a non-conductive material.

According to the present invention there is also provided: An apparatus for plasma-assisted etching of integrated circuits, comprising: wafer supports for supporting a wafer containing partially fabricated integrated circuits face down, with the backside of said wafer adjacent to a powered electrode; a ground electrode positioned approximately in opposition to said powered electrode, said grounded electrode being supported by a base plate in fixed relation to reactor sidewalls; and a gas distributor consisting essentially of a non-conductive material which is fixed in relation to said grounded electrode, said gas distributor comprising orifices connected to exude gas in proximity to said wafer face; said grounded electrode and sidewalls being movable as a unit toward said powered electrode to effect a vacuum-tight seal between said powered electrode and sidewalls.

According to the present invention there is also provided: A method for plasma-assisted etching of integrated circuit structures, comprising the steps of: supporting a wafer face down; supplying a flow of process gasses to a chamber contiguous with the underside of said supported wafer; and applying rf power to said chamber to generate a plasma in proximity to the underside of said wafer; wherein said process gasses are supplied using an orifice pattern and pressure such that transport of said process gasses (and of reaction products of said process gasses) to said face of said wafer is dominated by diffusion.

BRIEF DESCRIPTION OF THE DRAWINGS

The present invention will be described with reference to the accompanying drawings, wherein:

FIG. 1 shows a sample embodiment of a reactive ion etch machine according to the present invention;

FIG. 2 shows the plasma reactor of FIG. 1 in the closed position, as it would be during the actual etch process; and FIG. 3 shows a plan view of the reactor of FIG. 1.

DESCRIPTION OF THE PREFERRED EMBODIMENTS

The present invention provides major new concepts in semiconductor processing apparatus. The presently preferred embodiments will now be discussed in great detail, but it must be appreciated that the novel concepts which are included in these embodiments could also be used in many other embodiments, and the scope of the invention is not delimited by the particular examples shown.

FIG. 1 shows a sample embodiment of the invention, as a single slice reactor which can be used for reactive ion etching. (A very similar reactor design can be used for plasma etching, i.e. etching at pressures higher than 100 mTorr. The terms "plasma etching" and "reactive ion etching" (or "RIE") are sometimes kept distinct in the art, with RIE being used to refer to etching under conditions where ion bombardment is large, i.e. at lower pressure and with the wafer mounted on the powered electrode. This distinction will not be rigorously observed in the present application; the present invention is applicable to both plasma and RIE etching as conventionally distinguished, although some of the several novel features taught by the present application are more advantageous in the context of RIE etching processes.

After a wafer is placed onto tapered pins 50 (which are preferably made of a durable polymer, such as Ardel), the whole lower assembly, including the chamber 112, ground electrode 110, gas distributor 120, base plate 138, and top plate 114 are moved upward, using, e.g., an air cylinder or a vacuum feed through (not shown). Preferably a bellows 124 permits this vertical motion to occur while maintaining a vacuum-tight interface to the outside of the etch station. This vertical motion causes the backside of the wafer resting on pins 50 to make contact with the powered electrode 118, and at this point the sliding pin supports 130 which are attached to the underside of the tapered pins 50 retract slightly against a leaf spring 132. (Other elastic elements could be used in place of leaf spring 132, to assure a small amount of give in the pin supports 130, so that the wafer is not pressed against the powered electrode 118 with too much force.)

The last portion of the upward travel of this assembly causes the seal 134 to make closure between the quartz plate 114 at the top of the chamber 112 and the quartz plate 116 which surrounds the powered electrode 118.

A helium bleed port 134 is preferably provided to connect a helium supply to the back of the wafer. This helium supply means that the space between the low points of the powered electrode 118 and the wafer will be filled with helium, rather than vacuum, and this assures a reasonably low-thermal-resistance and highly repeatable thermal contact between the wafer and the powered electrode 118. Powered electrode 118 preferably includes coolant manifold spaces 136, to which coolant can be supplied.

In an alternative embodiment of the present invention, the tapered pins 50 are not mounted on sliding pin supports 130 supported by elastic elements 132, but are fixed. Since the helium bleed 134 assures good thermal contact between the back side of the wafer and the surface of the powered electrode 118, a tolerance of several thousands of an inch will still permit good rf coupling of the electrode 118 to the wafer, and still permit good thermal contact between the electrode 118 and the wafer. A tolerance of this magnitude should provide enough allowance for thermal expansions of chamber walls, variation in seal thickness, variation in wafer thickness, etc., to still permit reliable sealing of the lower chamber portion to the upper portion. Note that, in this embodiment, the quartz faces 114 and 116 would preferably be shaped slightly differently, to minimize the lateral spread of the plasma adjacent to the face of the wafer. However, the presently preferred embodiment does use sliding pin supports 130, since they permit the quartz piece 114 to confine the plasma closely near the face of the wafer 48 as shown in FIG. 2.

FIG. 2 shows the upper portion of the process station of FIG. 1, in the closed position, with a wafer 48 held therein for processing. After the reactor has been closed, the helium bleed can be started through port 134. At the same time, desired process gasses can be provided through a process gas distributor 120.

In the presently preferred embodiment, the process gas distributor 120 is made of quartz, so that it does not pick up eddy currents from the rf power present. Moreover, since the surface of the quartz is highly insulating, the plasma boundary near the quartz will not have as much voltage nor as much current across it as the plasma boundary near a grounded conductive element would. This means that plasma-assisted reactions near the quartz will not occur at as high a rate as they would near a grounded conductive element, so that deposition is reduced.

It should also be noted that quartz is a fairly good thermal insulator, and the temperature of the susceptor may therefore be raised (by radiation from the plasma) to 100 or 200 degrees C. This is advantageous, since raising the temperature of the distributor will further reduce deposition on it.

Under the preferred operating conditions (10 to 100 microns of pressure, and 400 to 800 watts of applied power) the generated plasma will fill the chamber between powered electrode 118 and ground electrode 110 fairly uniformly. Thus, the gas distributor 120 protrudes into the densest part of the plasma. The gas distributor 120 is preferably a ring, of perhaps one-half the diameter of the wafer being processed, with hollow supports which lead down to gas connections 140 mounted in the base plate 138.

Preferably, a quick-connect mounting is provided for the quartz distributor 120, so it can rapidly and easily be changed out as desired.

The gas distributor 120 is, in the presently preferred embodiment, spaced away from the surface of the wafer by about four centimeters. This spacing, and the exact shape of the gas distributor 120, and the spacing of the ports 122 on the gas distributor, are none of them critical. These parameters can be changed if desired, but, if modified, they should be selected so that diffusion of process gasses and process gas products from the ports 122 in the gas distributor 120 provides: (1) diffusion-dominated transport of the process gasses and process gas products to the plasma boundary at the face of the wafer 48; and (2) a fairly uniform concentration of process gasses and process gas products at the plasma boundary next to the face of wafer 48. For example, the spacing of the distributor away from the wafer face could be anywhere in the range from one to fifteen cm.

Under these low pressure conditions, and given the high area ratio between the area of electrode 118 in contact with the plasma (which, in this embodiment, is essentially the same as the area of water 48), and the grounded electrode area (which in this embodiment is essentially the area of ground electrode 110, plus the interior area of chamber walls 112 and the exposed upper area of base plate 138), a high density of plasma bombardment will occur at the face of wafer 48. As is well-known to those skilled in the art, this ion bombardment assists in achieving desirable anisotropy effects during etching.

The ground plane electrode 110 is preferably cooled, using coolant lines 150 connected to manifold cavities inside the electrode 110. If additional cooling is needed, the walls 112 may also be cooled.

Note that lines 150 are preferably flexible hoses, to accommodate the vertical travel of the whole lower etching chamber (110, 112, 138, 120, 114) as described above. The gas supply tube 150, which supplies process gasses through connection 140 to the gas distributor 120, is preferably also flexible for the same reason. If flexure of these hoses is found to generate excess particulates, a gas feed outside the bellows 124, through the side of the base plate 138, could be used instead.

FIG. 3 shows a plan view of the reactor of FIG. 1. The shape of the gas distributor 120 can be seen more clearly in this plan view. It can also be seen that the base plate 138 includes substantial spaces around the edge of the ground electrode 110, which provide a passage from the gas feed ports 122 to a vacuum pump below.

The overall gas flow in this reactor is downward, away from the face of the wafer, which assists in reducing particulates.

After the desired etching operation has finished, gas supply through gas distributor 120 is cut off, and the reactor can be pressure-equalized to its surroundings and opened, so that the wafer may be removed. A holding time may optionally be interposed, for thermal stabilization of the process station or for release of possible suspended particulates, before the reactor is opened.

Thus, the present invention provides all of the advantages listed above, and others besides. The present invention can be very widely modified and varied, and its scope is not limited except as specified in the claims.

What is claimed is:

1. A method of feeding process gases into a plasma processing chamber for diffusion-dominated transport of the process gases and process gas products to the plasma boundary at the face of a wafer, comprising the steps of:

emitting process gases from a gas distributor into the densest part of the plasma within the processing chamber; and directing the process gases emitting from the gas distributor away from the surface of the wafer.

2. The method of claim 1, further comprising the step of:

providing that the wafer is face-down during plasma processing.

3. The method of claim 2, further comprising the step of:

exhausting gas from the plasma processing chamber, at a location below the gas distributor.

4. The method of claim 1, further comprising the step of:

providing that the gas distributor is made of an insulating material.

5. The method of claim 4, further comprising the step of:

providing that the insulating material is quartz.

6. The method of claim 4, further comprising the step of:
locating the gas distributor a distance selected from the range of one to fifteen centimeters, from the face of the wafer.

7. The method of claim 1, further comprising the step of:
supplying rf power to the process gases to form the plasma.

8. The method of claim 7, further comprising the step of:
supplying the rf power via an electrode positioned against the back of the wafer.

9. The method of claim 1, further comprising the step of:
providing that the gas distributor is ring-shaped.

10. The method of claim 9, further comprising the step of:
providing that the diameter of the ring-shaped distributor is approximately one-half the diameter of the wafer.

11. The method of claim 9, further comprising the step of:
providing at least one hollow support to support the gas distributor and to supply the process gasses to the gas distributor.

12. The method of claim 1, further comprising the step of: operating the plasma processing chamber at low pressure.

13. A plasmas process gas distribution system for diffusion-dominated transport of process gases and process gas products to the plasma boundary at the face of a wafer, comprising:

a process gas distributor located within the region of the densest part of the plasma within a process chamber;
vents in the gas distributor for directing the process gases away from the surface of the wafer.

14. The system of claim 13, wherein said wafer is face-down during plasma processing.

15. The system of claim 14, further comprising: a gas exhaust port located below the gas distributor, for exhausting gas from the process chamber.

16. The system of claim 13, wherein the gas distributor is comprised of an insulating material.

17. The system of claim 16, wherein the insulating material is quartz.

18. The system of claim 16, wherein the gas distributor is located a distance selected from the range of one to fifteen centimeters, from the face of the wafer.

19. The system of claim 13, wherein rf power is supplied to the process gases to form the plasma.

20. The system of claim 19, wherein the rf power is supplied via an electrode positioned against the back of the wafer.

21. The system of claim 13, wherein the gas distributor is ring-shaped.

22. The system of claim 21, wherein the diameter of the ring-shaped distributor is approximately one-half the diameter of the wafer.

23. The system of claim 21, further comprising: at least one hollow support for supporting the gas distributor and for supplying the process gases to the gas distributor.

24. The system of claim 13, wherein the plasma processing chamber is operated at low pressure.

* * * * *